(12) United States Patent
Lee et al.

(10) Patent No.: US 12,028,990 B2
(45) Date of Patent: Jul. 2, 2024

(54) MULTILAYER BOARD AND METHOD FOR MANUFACTURING SAME

(71) Applicant: STEMCO CO., LTD., Cheongju-si (KR)

(72) Inventors: Sung Jin Lee, Cheongju-si (KR); Young Jun Kim, Cheongju-si (KR); Su Jeong Shin, Cheongju-si (KR)

(73) Assignee: STEMCO CO., LTD., Cheongju-si (KR)

(*) Notice: Subject to any disclaimer, the term of this patent is extended or adjusted under 35 U.S.C. 154(b) by 165 days.

(21) Appl. No.: 17/371,327

(22) Filed: Jul. 9, 2021

(65) Prior Publication Data

US 2021/0337675 A1    Oct. 28, 2021

Related U.S. Application Data

(63) Continuation of application No. PCT/KR2020/000250, filed on Jan. 7, 2020.

(30) Foreign Application Priority Data

Jan. 11, 2019    (KR) .................. 10-2019-0003806

(51) Int. Cl.
*H05K 1/09*    (2006.01)
*H05K 3/28*    (2006.01)
(Continued)

(52) U.S. Cl.
CPC .......... *H05K 3/4644* (2013.01); *H05K 1/09* (2013.01); *H05K 3/282* (2013.01); *H05K 3/38* (2013.01);
(Continued)

(58) Field of Classification Search
None
See application file for complete search history.

(56) References Cited

U.S. PATENT DOCUMENTS 8,872,041 B2    10/2014    Lee et al.
8,878,077 B2    11/2014    Ito et al.
(Continued)

FOREIGN PATENT DOCUMENTS

JP    2012-094734 A    5/2012
KR    10-2010-0109699 A    10/2010
(Continued)

OTHER PUBLICATIONS

International Search Report issued in PCT/KR2020/000250; mailed Apr. 14, 2020.
(Continued)

*Primary Examiner* — Timothy J Thompson
*Assistant Examiner* — John B Freal
(74) *Attorney, Agent, or Firm* — Studebaker & Brackett PC (57) ABSTRACT

Provided are a multilayer board and a method for manufacturing same, in which a different kind of metal layer is formed between an upper metal layer and an interlayer insulating layer, the different kind of metal layer being formed only in a wiring area without being formed in a via area. The multilayer board comprises: a substrate layer; a plurality of first metal layers sequentially stacked on the substrate layer; an interlayer insulating layer formed between two different first metal layers, having a first via hole, and electrically connecting the two different first metal layers through a third metal layer formed in the first via hole; and a second metal layer formed between the upper layer of the two different first metal layers and the interlayer insulating layer.

9 Claims, 6 Drawing Sheets

(51) Int. Cl.
*H05K 3/38* (2006.01)
*H05K 3/46* (2006.01)
(52) U.S. Cl.
CPC ............. *H05K 2201/0352* (2013.01); *H05K 2201/09509* (2013.01)

(56) References Cited

U.S. PATENT DOCUMENTS

| | | | | |
|---|---|---|---|---|
| 2009/0084588 | A1* | 4/2009 | Sekine | H01L 21/76898 427/97.8 |
| 2010/0109052 | A1* | 5/2010 | Nakajima | H01L 21/823475 257/E27.06 |
| 2012/0024583 | A1 | 2/2012 | Lee et al. | |
| 2012/0103667 | A1* | 5/2012 | Ito | H05K 3/108 174/257 |

FOREIGN PATENT DOCUMENTS

| | | |
|---|---|---|
| KR | 10-2012-0012270 A | 2/2012 |
| KR | 10-1156776 B1 | 6/2012 |
| KR | 10-2013-0051124 A | 5/2013 |
| WO | 03/032701 A1 | 4/2003 |

OTHER PUBLICATIONS

"Notice of Final Rejection" Office Action issued in KR 10-2019-0003806; mailed by the Korean Intellectual Property Office on Aug. 12, 2020.

An Office Action; "Notice of Reasons for Refusal," mailed by the Japanese Patent Office on Jul. 26, 2022, which corresponds to Japanese Patent Application No. 2021-540160 and is related to U.S. Appl. No. 17/371,327.

* cited by examiner

MULTILAYER BOARD AND METHOD FOR MANUFACTURING SAME

CROSS-REFERENCE TO RELATED APPLICATIONS

This application is a Continuation of International Application No. PCT/KR2020/000250 filed Jan. 7, 2020, which claims benefit of priority to Korean Patent Application No. 10-2019-0003806 filed Jan. 11, 2019, the entire content of which is incorporated herein by reference.

TECHNICAL FIELD

The present invention relates to a circuit board and a method of manufacturing the same. More particularly, the present invention relates to a multilayer circuit board and a method of manufacturing the same.

BACKGROUND ART

A multilayer printed circuit board refers to a board in which a plurality of printed circuit boards (PCBs) are stacked to provide three or more layers of wiring surfaces. In such a multilayer printed circuit board, an interlayer insulating layer is added on a base board to perform layer-up.

DISCLOSURE

Technical Problem

Figure 1:
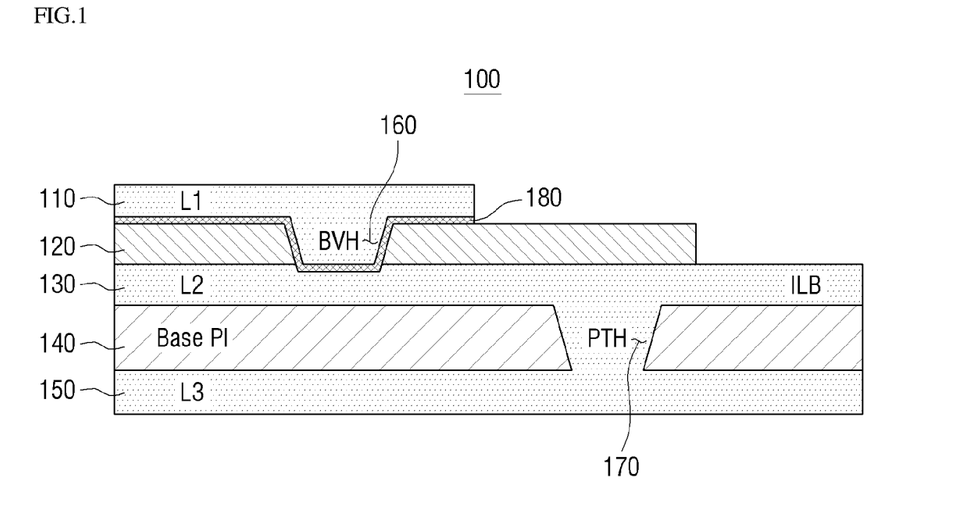
FIG. 1 is a cross-sectional view illustrating a build-up type multilayer board.

As shown in FIG. 1, in a build-up type multilayer board 100, conductive layers 110, 130, 150 and insulating layers 120 and 140 are alternately formed, and vias 160 and 170 are formed between the layers to electrically connect the conductive layers 110, 130, 150 spaced apart from each other.

However, when the via 160 (BVH) is formed in the interlayer insulating layer 120 coated on the conductive layer 130 (L2), processes of additionally forming a protective layer to prevent damage to an exposed pattern other than the via, which may occur after an etching process in order to remove smears remaining in the via 160 (BVH), or removing the protective layer must be separately added, and thus the overall process may be complicated.

Further, a phenomenon in which a line width or a surface of a circuit pattern is damaged in other open areas may occur due to a photolithography process for forming the conductive layer 110 (L1).

Further, a nickel-chromium (Ni—Cr) layer 180 formed to improve the adhesion between the interlayer insulating layer 120 and the conductive layer 110 (L1) includes a material having excellent bonding force with both the layers 110 and 120, but this may lower interlayer electrical characteristics and durability in the via 160 (BVH).

The object to be solved by the present invention is to provide a multilayer board and a method of manufacturing the same, in which a different kind of metal layer is formed between an upper metal layer and an interlayer insulating layer, and the different kind of metal layer is not formed in a via area and is formed only in a wiring area.

It should be noted that objects of the present invention are not limited to the above-described object, and other objects of the present invention will be apparent to those skilled in the art from the following descriptions.

Technical Solution

One aspect of the present invention provides a multilayer board including a substrate layer, a plurality of first metal layers sequentially stacked on the substrate layer for wiring, an interlayer insulating layer formed between two different first metal layers, having a first via hole, and electrically connecting the two different first metal layers through a third metal layer formed in the first via hole, and a second metal layer formed between an upper layer of the two different first metal layers and the interlayer insulating layer.

The second metal layer and the first metal layer may be different from each other in a metal composition or a crystal structure.

When the second metal layer and the first metal layer are different from each other in the crystal structure, the second metal layer may be formed of any one of a metal layer including a metal having a face-centered cubic structure and a metal layer including a metal having a body-centered cubic structure, and the first metal layer may be formed of the other metal layer.

The second metal layer may be formed to have a thickness less than a thickness of each of the first metal layers.

The second metal layer may be formed to have a thickness of 1 nm to 50 nm.

The third metal layer and the first metal layer may have the same metal composition or crystal structure.

The first metal layers, the interlayer insulating layer, and the second metal layer may be formed only on one surface of the substrate layer or formed on both surfaces of the substrate layer.

The multilayer board may further include a protective layer formed on an L1 layer located on the uppermost side of the plurality of first metal layers.

The multilayer board may further include an element mounting area electrically connected to an external device, wherein a layer formed below the L1 layer located on the uppermost side of the plurality of first metal layers may be exposed in the element mounting area.

The multilayer board may further include a fourth metal layer formed on the second metal layer and in the first via hole, wherein the fourth metal layer may be formed to have the same metal composition or crystal structure as the first metal layer, and may be formed to have a thickness of 0.01 μm to 5 μm.

Another aspect of the present invention provides a method of manufacturing a multilayer board, the method including forming a first metal layer on a substrate layer, forming an interlayer insulating layer on the first metal layer, forming a second metal layer on the interlayer insulating layer, forming a first via hole through the second metal layer and the interlayer insulating layer, forming a third metal layer in the first via hole, and additionally forming the first metal layer on the second metal layer and the third metal layer.

The forming of the third metal layer and the additional forming of the first metal layer may be performed simultaneously.

In the forming of the second metal layer, the second metal layer having a different metal composition or crystal structure from that of the first metal layer may be formed, and in the forming of the third metal layer, the third metal layer having the same metal composition or crystal structure as the first metal layer may be formed.

The method may further include forming a fourth metal layer on the second metal layer and in the first via hole, which is performed between the forming of the first via hole and the forming of the third metal layer, wherein the fourth metal layer may have the same metal composition or crystal structure as the first metal layer.

In the forming of the second metal layer, the second metal layer may be formed on the first metal layer on which the interlayer insulating layer is not stacked, and the method may further include removing the second metal layer, which is formed on the first metal layer on which the interlayer insulating layer is not stacked, performed between the forming of the third metal layer and the additional forming of the first metal layer.

The method may further include forming a protective layer on the first metal layer, which is located on the uppermost side, performed after the additional forming of the first metal layer.

The first metal layer and the third metal layer may have the same metal composition or crystal structure, and the forming of the third metal layer and the additional forming of the first metal layer may be performed simultaneously.

The forming of the interlayer insulating layer, the forming of the second metal layer, the forming of the first via hole, the forming of the third metal layer, and the additional forming of the first metal layer may be repeated a plurality of times before forming the protective layer.

Specific items of other embodiments are included in the detailed descriptions and drawings.

Advantageous Effects

The present invention relates to a multilayer board in which, when one or more interlayer insulating layers and one or more first metal layers are alternately formed on one surface of a substrate layer, a second metal layer having a different composition or crystal structure from the upper first metal layer is formed between the interlayer insulating layer and the upper first metal layer in a wiring area, and a third metal layer having the same composition or crystal structure as the upper first metal layer is formed in a via area.

The present invention can obtain the following effects through the above-described structure.

First, a surface of the interlayer insulating layer and an inner lead bonding (ILB) pattern can be protected due to the second metal layer during etching for removing smears in a process of forming a multilayer pattern.

Second, interlayer reliability can be secured because the same type of metal is plated in the via hole.

Third, resistance characteristics can be improved.

Fourth, a process of manufacturing the multilayer board can be simplified.

MODES OF THE INVENTION

Hereinafter, exemplary embodiments of the present invention will be described in detail with reference to the accompanying drawings. Advantages and features of the present invention and methods for accomplishing the same will be more clearly understood from embodiments described below with reference to the accompanying drawings. However, the present invention is not limited to the embodiments disclosed below, but may be implemented in various different forms. The embodiments are provided only to make the disclosure of the present invention complete, and to fully inform the scope of the invention to those skilled in the art to which the present invention pertains. The invention is only defined by the scope of the claims. Throughout the specification, like reference numerals refer to like elements.

When it is described that an element or layer is "on" or "above" another element or layer, it includes a case where still another element or layer is interposed in the middle as well as directly above another element or layer. On the other hand, when it is described that an element is "directly on" or "directly above" another element, it indicates that there is no intervening element or layer.

The spatially relative terms "below," "beneath," "lower," "above," "upper," or the like may be used to easily describe the correlation between one element or component and another element or component as shown in the drawings. The spatially relative terms should be understood as terms including different directions of an element in use or operation in addition to the directions shown in the drawings. For example, if an element shown in the drawings is turned over, an element described as "below" or "beneath" of another element may be placed "above" another element. Accordingly, an exemplary term "below" may include both the directions below and above. An element may also be oriented in different directions, so that the spatially relative terms may be interpreted depending on the orientation.

Although the first, second, and the like are used to describe various elements, components, and/or sections, it goes without saying that these elements, components, and/or sections are not limited by these terms. These terms are only used to distinguish one element, component, or section from other elements, components, or sections. Accordingly, it goes without saying that a first element, a first component, or a first section described below may be a second element, a second component, or a second section within the technical spirit of the present invention.

The terms used herein are for the purpose of describing embodiments and are not intended to be limiting of the present invention. In the present specification, the singular also includes the plural unless specifically stated otherwise in the phrase. The terms "comprises" and/or "comprising" as used herein specify some stated components, steps, operations and/or elements, but do not exclude the presence or addition of one or more other components, steps, operations, and/or elements mentioned.

Unless otherwise defined, all terms (including technical and scientific terms) used herein may be used in a sense that may be commonly understood by those of ordinary skill in the art. In addition, the terms defined in the commonly used dictionaries are not ideally or excessively interpreted unless they are specifically defined clearly.

Hereinafter, embodiments of the present invention will be described in detail with reference to the accompanying drawings. In the description with reference to the accompanying drawings, the same or corresponding components are assigned the same reference numbers regardless of drawing numbers, and a redundant description thereof will be omitted.

Hereinafter, the present invention will be described in detail with reference to the drawings and the like.

Figure 2:
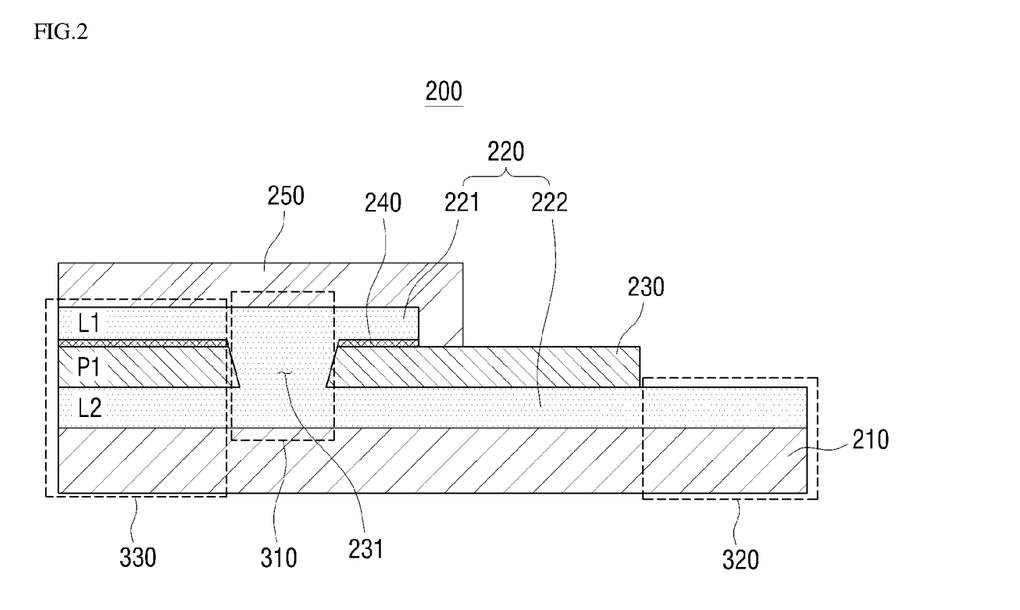
FIG. 2 is a cross-sectional view of a multilayer board according to one embodiment of the present invention.

FIG. 2 is a cross-sectional view of a multilayer board according to one embodiment of the present invention.

Referring to FIG. 2, a multilayer board 200 according to the present invention includes a substrate layer 210, first metal layers 220, an interlayer insulating layer 230, a second metal layer 240, and a protective layer 250.

The substrate layer 210 is a base film having a predetermined thickness (e.g., 5 µm to 100 µm). The substrate layer 210 may be formed in the form of a film, may be formed of a flexible film, and may also be formed of a rigid film, a rigid-flexible film, and the like.

The substrate layer 210 may be formed using at least one material selected from among polymer materials including polyimide, polyethylene terephthalate (PET), poly-ethylene naphthalate (PEN), polycarbonate, epoxy, glass fiber, and the like as a material thereof. The substrate layer 210 may also be formed using various other polymer materials as a material thereof. In the present embodiment, descriptions will be made by defining the substrate layer 210 as a polyimide film, but the substrate layer 210 is not necessarily limited to a polyimide film.

A seed layer (or an under layer) (not shown) may be formed on one surface or both surfaces of the substrate layer 210. The seed layer (or under layer) may be made of a conductive material to improve the adhesion between the substrate layer 210 and the first metal layers 220.

As an example, the seed layer (or under layer) may be formed using at least one metal selected from among nickel (Ni), chromium (Cr), copper (Cu), gold (Au), and the like as a material thereof, and may be formed on the substrate layer 210 using a method such as vacuum evaporation, adhesion, plating, or the like.

The first metal layers 220 serve as lines that electrically connect electronic components mounted on the multilayer board 200. The first metal layers 220 are formed on the substrate layer 210.

The first metal layers 220 may be formed on the substrate layer 210 using at least one metal selected from among nickel (Ni), chromium (Cr), copper (Cu), gold (Au), silver (Ag), platinum (Pt), and the like as a material thereof. The first metal layers 220 may be formed on the substrate layer 210 using a method such as printing, photolithography, coating, adhesion, or the like.

Figure 3:
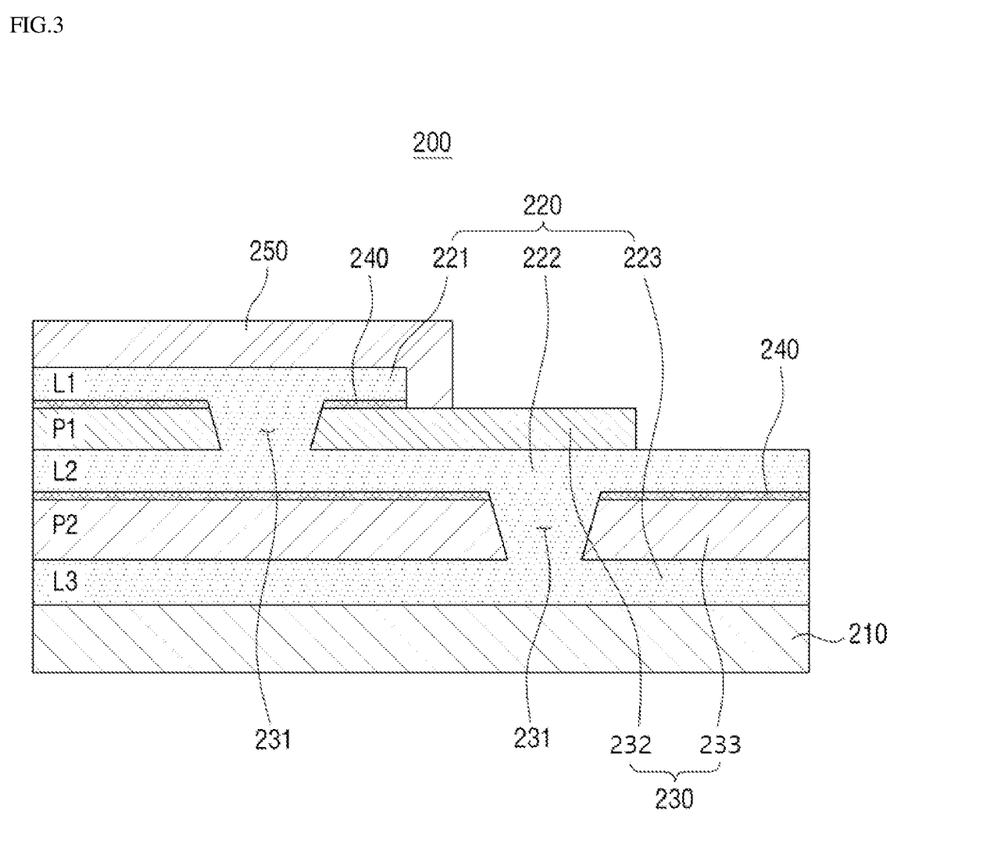
FIG. 3 is a cross-sectional view of a multilayer board according to another embodiment of the present invention.

The first metal layers 220 may be sequentially stacked on one surface of the substrate layer 210 and may be formed as a plurality of layers. As an example, as shown in FIG. 2, the first metal layers 220 may be formed of two layers, such as an L1 layer 221 and an L2 layer 222. However, the present embodiment is not limited thereto. As shown in FIG. 3, the first metal layers 220 may be formed of three layers, such as an L1 layer 221, an L2 layer 222, and an L3 layer 223, or may also be formed of four or more layers. FIG. 3 is a cross-sectional view of a multilayer board according to another embodiment of the present invention.

A description will be made with reference again to FIG. 2.

When the first metal layer 220 is formed on one surface of the substrate layer 210 as a plurality of layers, among upper and lower layers with the interlayer insulating layer 230 interposed therebetween, the lower layer may be formed to have a greater area than the upper layer. As an example, when the first metal layers 220 are formed of the L1 layer 221, the L2 layer 222, and the like, the L2 layer 222 may be formed to have a greater area than the L1 layer 221. However, the present embodiment is not limited thereto.

Some layers of the plurality of layers constituting the first metal layers 220 may be formed to have the same area, or all of the plurality of layers may be formed to have the same area.

When the first metal layers 220 are formed on one surface of the substrate layer 210 as a plurality of layers, two layers located on upper and lower sides may be electrically connected through a third metal layer filling a first via hole 231. At this point, the third metal layer, which fills the first via hole 231, may be formed using the same kind of metal as the first metal layers 220 as a material thereof, but may also be formed using a different kind of metal from those of the first metal layers 220 as a material thereof.

When the first metal layers 220 are formed on one surface of the substrate layer 210 as a plurality of layers, the plurality of layers may be formed to have the same thickness. However, the present embodiment is not limited thereto. Some layers of the plurality of layers may be formed to have the same thickness, and some other layers thereof may be formed to have different thicknesses. Also, all of the plurality of layers may be formed to have different thicknesses.

Figure 4:
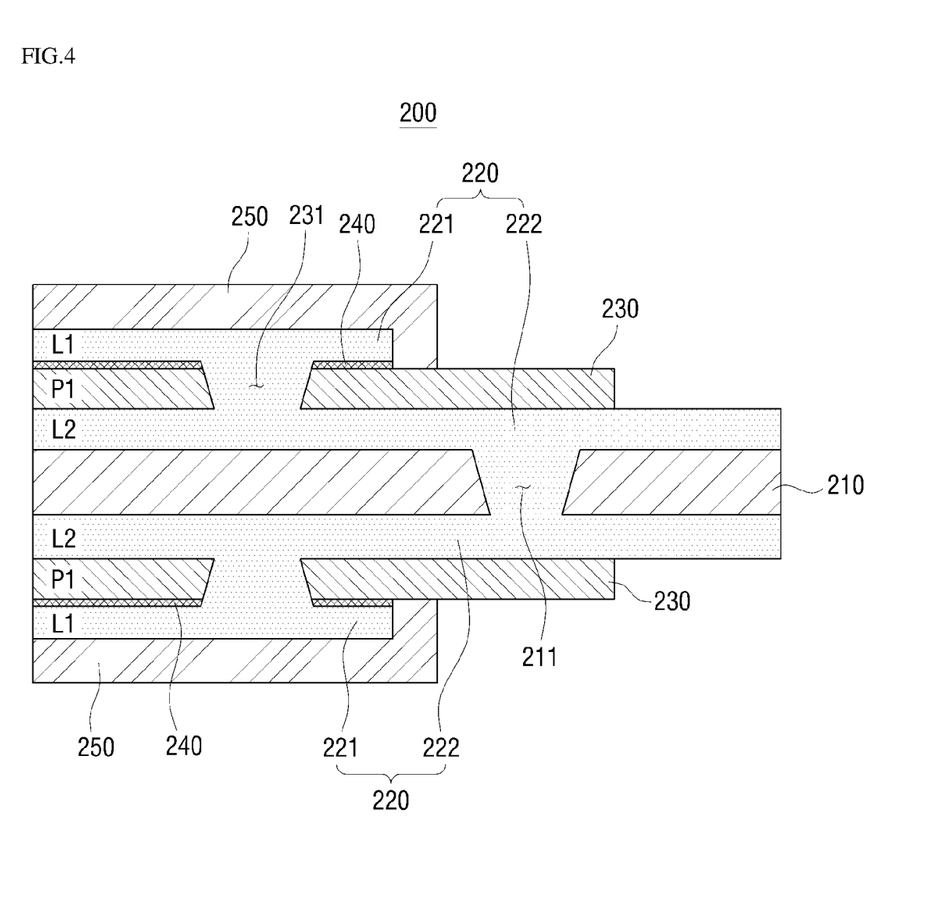
FIG. 4 is a cross-sectional view of a multilayer board according to still another embodiment of the present invention.

As shown in FIG. 4, first metal layers 220 may also be formed on both surfaces of a substrate layer 210. When the first metal layers 220 are formed on both surfaces of the substrate layer 210, the substrate layer 210 may include at least one second via hole 211. The first metal layers 220 formed on both surfaces of the substrate layer 210 may be electrically connected through a metal layer filling the second via hole 211. FIG. 4 is a cross-sectional view of a multilayer board according to still another embodiment of the present invention.

When the first metal layers 220 are formed on both surfaces of the substrate layer 210 as a plurality of layers, the first metal layers 220 may be formed of the same number of layers on each of the both surfaces of the substrate layer 210. However, the present embodiment is not limited thereto. The first metal layers 220 may be formed of a different number of layers on each of the both surfaces of the substrate layer 210.

A description will be made with reference again to FIG. 2.

The interlayer insulating layer 230 serves as an insulator (or a dielectric). The interlayer insulating layer 230 is formed between the two first metal layers 220, that is, the L1 layer 221 and the L2 layer 222, which are vertically formed on one surface of the substrate layer 210.

The interlayer insulating layer 230 may be formed using the same kind of material as the substrate layer 210 as a material thereof. As an example, the interlayer insulating layer 230 may be formed using polyimide (e.g., liquid polyimide) as a material thereof. However, the present embodiment is not limited thereto. The interlayer insulating layer 230 may also be formed using a material, which may act as an insulator, among materials different from that of the substrate layer 210 as a material thereof.

The interlayer insulating layer 230 may be formed between the two first metal layers 220 (the L1 layer 221 and the L2 layer 222) located on upper and lower sides using a method such as printing, coating, adhesion, photolithography, or the like. At this point, the interlayer insulating layer 230 may be formed to cover a portion or all of an upper surface of the L2 layer 222 located on the lower side. However, the present embodiment is not limited thereto. The interlayer insulating layer 230 may also be formed by being divided into a plurality of areas on the L2 layer 222.

The interlayer insulating layer 230 may include at least one first via hole 231. The first via hole 231 is filled with the third metal layer and serves to electrically connect the two first metal layers 220 (the L1 layer 221 and the L2 layer 222) located on upper and lower sides.

The first via hole 231 may be formed in the interlayer insulating layer 230 using a method such as plasma etching, laser drilling, or the like. The first via hole 231 may also be formed in the interlayer insulating layer 230 using other methods.

The first via hole 231 may be formed to have upper and lower portions whose widths are different from each other. As an example, the first via hole 231 may be formed such that the width of the upper portion is greater than that of the lower portion. However, the present embodiment is not limited thereto. The first via hole 231 may also be formed such that the width of the upper portion is less than that of the lower portion or the widths of the upper portion and the lower portion are the same.

Meanwhile, the third metal layer filling the first via hole 231 may fill the first via hole 231 using a method such as plating, printing, or the like. In this case, the third metal layer may be formed using a metal having the same composition or crystal structure as that of the first metal layer 220 as a material thereof, but the present invention is not limited thereto, and the third metal layer may also be formed using a metal different from that of the first metal layer 220 as a material thereof.

Meanwhile, as shown in FIG. 4, in order to electrically connect the first metal layer 220 formed on one surface of the substrate layer 210 and the first metal layer 220 formed on the other surface of the substrate layer 210, at least one second via hole 211 may be formed in the substrate layer 210.

The second via hole 211 may be formed in the substrate layer 210 in the same manner as the first via hole 231 and may be formed in the substrate layer 210 in the same form as the first via hole 231. However, in the present embodiment, the formation method and shape of the second via hole 211 are not limited thereto.

The interlayer insulating layer 230 may be formed on the substrate layer 210 as at least one layer. When all of the interlayer insulating layers 230 are formed between the two first metal layers 220, and the first metal layers 220 are formed of N layers (where N is a natural number) on one surface of the substrate layer 210, the interlayer insulating layers 230 may be formed of N−1 layers. As an example, when the first metal layers 220 are formed of two layers, such as the L1 layer 221 and the L2 layer 222 as shown in FIG. 2, the interlayer insulating layer 230 may be formed of one layer, such as a P1 layer, and when the first metal layers 220 are formed of three layers, such as the L1 layer 221, the L2 layer 222, and the L3 layer 223 as shown in FIG. 3, the interlayer insulating layers 230 may be formed of two layers, such as a P1 layer 232 and a P2 layer 233.

However, the present embodiment is not limited thereto. Some of the interlayer insulating layers 230 may not be formed between the two first metal layers 220, and thus when the first metal layers 220 are formed on one surface of the substrate layer 210 as N layers, the interlayer insulating layers 230 may be formed of layers less than N−1 layers.

When the interlayer insulating layers 230 are formed on one surface of the substrate layer 210 as a plurality of layers, some layers may be formed to cover a portion of an upper surface of the first metal layer 220 located therebelow, and some other layers may be formed to cover the entire upper surface of the first metal layer 220 located therebelow. In FIG. 3, the P1 layer 232 is an example of a case in which the interlayer insulating layer 230 is formed to cover a portion of the upper surface of the L2 layer 222 located therebelow, and the P2 layer 233 is an example of a case in which the interlayer insulating layer 230 is formed to cover the entire upper surface of the L3 layer 223 located therebelow.

When the interlayer insulating layers 230 are formed on one surface of the substrate layer 210 as a plurality of layers, all of the plurality of layers may be formed to have the same thickness. However, the present embodiment is not limited thereto. Some layers of the plurality of layers may be formed to have the same thickness, and the remaining layers thereof may be formed to have different thicknesses. Alternatively, all of the plurality of layers may be formed to have different thicknesses.

Meanwhile, the interlayer insulating layer 230 may be formed of a single layer between the two first metal layers 220 located on upper and lower sides, but may also be formed of a plurality of layers therebetween. When the interlayer insulating layer 230 is formed of a plurality of layers between the two first metal layers 220, the upper layer may be formed to have a smaller area than the lower layer, but the upper layer may also be formed to have the same area as the lower layer.

Meanwhile, the first metal layer 220 (e.g., the L1 layer 221) formed on the interlayer insulating layer 230 may be formed to cover the entire upper surface of the interlayer insulating layer 230, and may also be formed to cover a portion of the upper surface of the interlayer insulating layer 230.

The second metal layer 240 is formed between the first metal layer 220 located thereabove, that is, the L1 layer 221 and the interlayer insulating layer 230 located therebelow, that is, the P1 layer. The second metal layer 240 may be formed using a metal having a different composition or crystal structure from that of the first metal layer 220 as a material thereof.

When the first via hole 231 is formed in the interlayer insulating layer 230, a material constituting the interlayer insulating layer 230 may remain on a side surface or a lower portion of the first via hole 231. Thus, this residue (smear) must be removed by a method such as plasma etching.

However, when the second metal layer 240 is formed on the interlayer insulating layer 230 (and a portion of the upper surface of the L2 layer 222 on which the interlayer insulating layer 230 is not stacked) as illustrated in the present embodiment, the interlayer insulating layer 230 (and a portion of the upper surface of the L2 layer 222 on which the interlayer insulating layer 230 is not stacked) may be prevented from deteriorating or being damaged by the second metal layer 240 when a process of desmearing is performed.

The second metal layer 240 may be formed between the interlayer insulating layer 230 and each of the first metal layers 220. However, the present embodiment is not limited thereto. The second metal layer 240 may be formed between the interlayer insulating layer 230 and some of the first metal layers 220, and may not be formed between the interlayer insulating layer 230 and the remaining first metal layers 220. As an example, the second metal layer 240 may be formed between the first metal layer 220 located on the uppermost side and the interlayer insulating layer 230 located below the second metal layer 240, and may not be formed on other layers.

The second metal layer 240 may be formed on the interlayer insulating layer 230 using various physical/chemical methods such as vacuum evaporation, printing, coating, adhesion, photolithography, plating, and the like. In the present embodiment, the second metal layer 240 may be formed on the interlayer insulating layer 230 by employing a vacuum evaporation method, but the present embodiment is not necessarily limited thereto.

The second metal layer 240 may be formed to have a thickness less than that of the first metal layer 220. As an example, the second metal layer 240 may be formed to have a thickness of about 1 nm to about 50 nm. However, the present embodiment is not limited thereto. The second metal layer 240 may also be formed to have the same thickness as the first metal layer 220 or to have a thickness greater than that of the first metal layer 220.

The second metal layer 240 may be formed on the interlayer insulating layer 230 using at least one metal selected from among nickel (Ni), chromium (Cr), copper (Cu), silver (Ag), platinum (Pt), and the like as a material thereof. As described above, the second metal layer 240 may be formed using a metal (or alloy) having a different composition from that of the first metal layer 220 as a material thereof.

The second metal layer 240 may also be formed using a metal (or alloy) having a different crystal structure from that of the first metal layer 220 as a material thereof. As an example, the first metal layer 220 may be formed of a metal (or alloy) having a face-centered cubic structure, and the second metal layer 240 may be formed of a metal (or alloy) having a body-centered cubic structure.

The protective layer 250 is used to protect the first metal layer 220 and the interlayer insulating layer 230 exposed on the multilayer board 200, and is formed on the remaining areas except for an element mounting area 320 electrically connected to external devices. The protective layer 250 may be formed to cover the first metal layer 220 located on an upper side, that is, the L1 layer 221, and may also be formed to cover a portion of the upper surface of the interlayer insulating layer 230, which is exposed to the outside, that is, a portion of the upper surface of the interlayer insulating layer 230 on which the second metal layer 240 and the L1 layer 221 are not stacked.

The protective layer 250 may be formed using an insulating material as a material thereof. As an example, the protective layer 250 may be formed using a solder resist as a material thereof and may be formed on the remaining areas except for the element mounting area 320 using a method such as printing, coating, photolithography, or the like.

Meanwhile, the multilayer board 200 may include a via area 310, the element mounting area 320, a wiring area 330, and the like.

The via area 310 is an area in which the first via hole 231, the second via hole 211, and the like are formed. Here, the first via hole 231 refers to a via hole formed in the interlayer insulating layer 230, and the second via hole 211 refers to a via hole formed in the substrate layer 210. In the present embodiment, only an area in which the first via hole 231 is formed may be defined as the via area 310.

The element mounting area 320 refers to an area to which an integrated-circuit (IC) chip or an external element is bonded.

The wiring area 330 refers to an area in which the first metal layer 220 (e.g., the L1 layer 221) serving as a wiring pattern is formed.

A plating layer (not shown) may be further formed on the first metal layer 220 (e.g., a portion of the upper surface of the L2 layer 222 exposed to the outside) formed in the element mounting area 320. When the plating layer is formed on the first metal layer 220 formed in the element mounting area 320, the electrical connection between the multilayer board 200 and the external element (or IC chip) may be improved.

The multilayer board 200 according to the present invention has been described above with reference to FIGS. 2 to 4. Hereinafter, a method of manufacturing the multilayer board 200 will be described.

Figure 5:
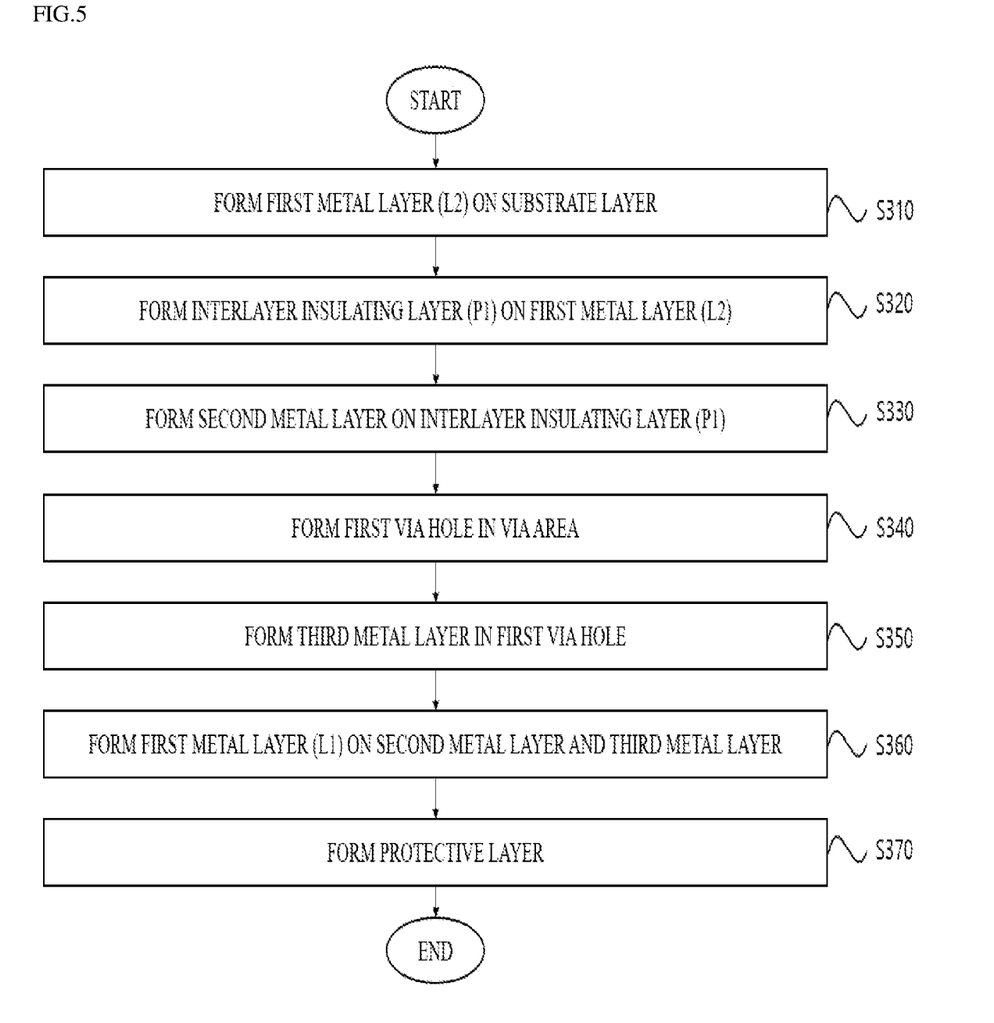
FIG. 5 is a flowchart schematically illustrating a method of manufacturing a multilayer board according to one embodiment of the present invention.

FIG. 5 is a flowchart schematically illustrating a method of manufacturing a multilayer board according to one embodiment of the present invention. Hereinafter, a description will be made with reference to FIGS. 2 and 5.

Figure 6:
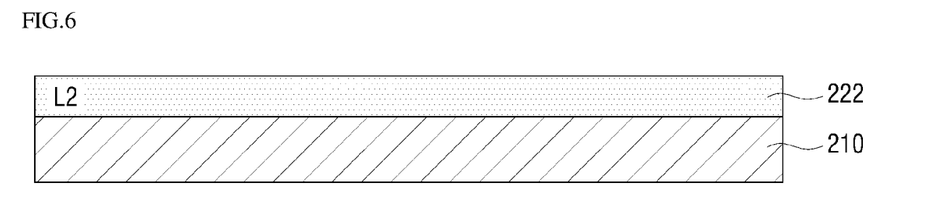
FIGS. 6 to 11 are reference views illustrating results of each operation performed according to the method of manufacturing the multilayer board according to one embodiment of the present invention.

First, an L2 layer 222 constituting first metal layers 220 is formed on a substrate layer 210 (S310). FIG. 6 shows a state in which the L2 layer 222 is formed on the substrate layer 210 according to operation S310.

A seed layer (or under layer) made of a conductive material may be formed on the substrate layer 210. When the seed layer (or under layer) is formed on the substrate layer 210, the adhesion between the substrate layer 210 and the L2 layer 222 may be improved. When the seed layer (or under layer) is formed on the substrate layer 210, the seed layer (or under layer) may be formed on the substrate layer 210 before performing operation S310.

Figure 7:
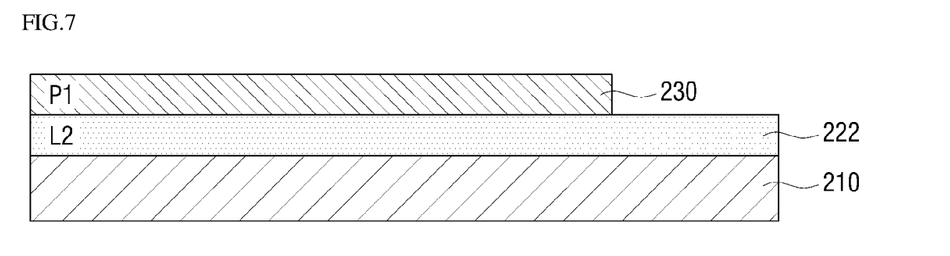

Thereafter, an interlayer insulating layer 230 is formed on the L2 layer 222 (S320). FIG. 7 shows a state in which the interlayer insulating layer 230 is formed on the L2 layer 222 according to operation S320.

Figure 8:
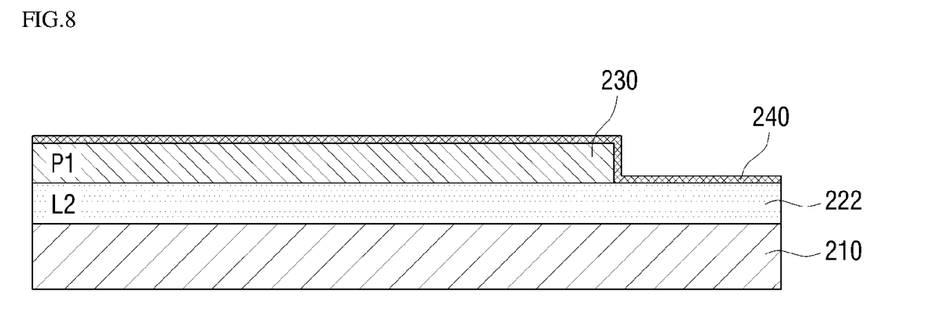

Thereafter, a second metal layer 240 is formed on the interlayer insulating layer 230 (S330). The second metal layer 240 may be formed on a portion of an upper surface of the interlayer insulating layer 230, but may also be formed on the entire upper surface of the interlayer insulating layer 230. Meanwhile, the second metal layer 240 may also be formed on a portion of an upper surface of the L2 layer 222 on which the interlayer insulating layer 230 is not stacked. FIG. 8 shows a state in which the second metal layer 240 is formed on the interlayer insulating layer 230 and a portion of the upper surface of the L2 layer 222, on which the interlayer insulating layer 230 is not stacked, according to operation S330.

Figure 9:
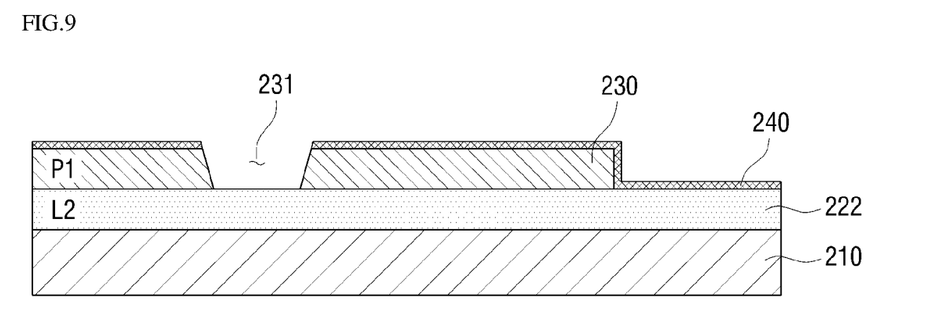

Thereafter, a first via hole 231 is formed in a via area 310 (S340). The first via hole 231 may be formed to pass through the second metal layer 240 and the interlayer insulating layer 230 so that two first metal layers 220, that is, an L1 layer 221 and the L2 layer 222, may be electrically connected. FIG. 9 shows a state in which the first via hole 231 is formed in the via area 310 according to operation S340.

Thereafter, the first via hole 231 is filled with metal to form a third metal layer in the first via hole 231 (S350).

The first via hole 231 may be filled with the same kind of metal as the first metal layer 220. When the third metal layer is thus formed in the first via hole 231, the flow of current between the third metal layer and the L2 layer 222 may be smoothed to reduce resistance therebetween, and accordingly, electrical characteristics of the multilayer board 200 may be improved.

Meanwhile, in the present embodiment, before the forming of the third metal layer in the first via hole 231 (i.e., between operations S340 and S350), a fourth metal layer having a predetermined thickness (e.g., 0.01 μm to 5 μm) may be formed on the second metal layer 240 and on an inner surface of the first via hole 231 using the same kind of metal as the first metal layer 220. When the fourth metal layer is formed on the second metal layer 240 and the inner surface of the first via hole 231, it is possible to prevent the third metal layer from being easily separated from the inside of the first via hole 231.

Meanwhile, the fourth metal layer may also be formed only on the second metal layer 240 or only on the inner surface of the first via hole 231.

Figure 10:
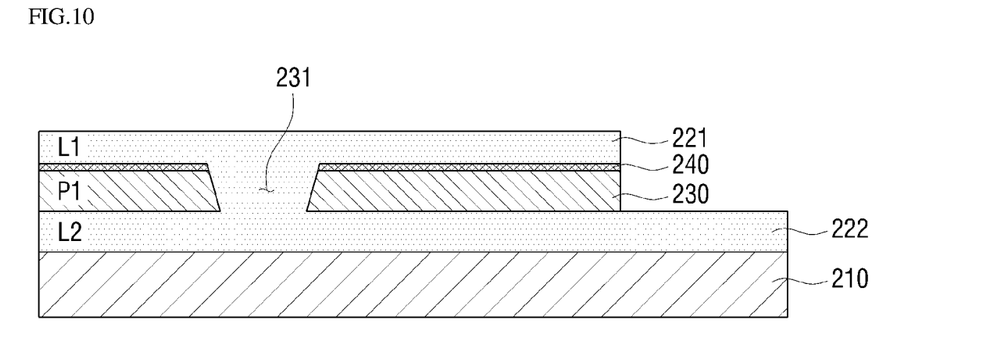

Thereafter, the L1 layer 221 constituting the first metal layers 220 is formed on the second metal layer 240 and the third metal layer (S360). As described above, when the first metal layers 220 are formed of a metal having the same composition or crystal structure as that of the third metal layer, a mutual bonding force between the L2 layer 222, the fourth metal layer, and the L1 layer 221 is improved, thereby improving interlayer reliability and electrical characteristics of the multilayer board 200. FIG. 10 shows a case in which the L1 layer 221 is formed on the second metal layer 240 and on the third metal layer.

Figure 11:
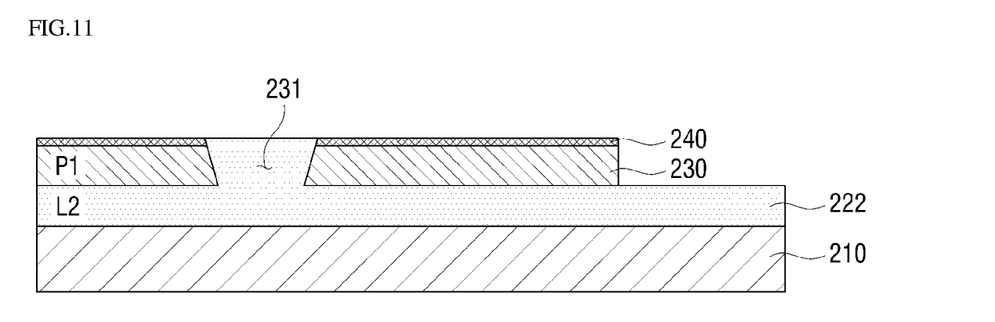

Meanwhile, before the forming of the L1 layer 221 on the second metal layer 240 and the first via hole 231 (i.e., between operations S350 and S360), an operation of removing the second metal layer 240 from a portion of the upper surface of the interlayer insulating layer 230, the upper surface of the L2 layer 222 in an element mounting area 320, and the like may be performed. FIG. 11 shows a state in which the second metal layer 240 is removed from a portion of the upper surface of the interlayer insulating layer 230, the upper surface of the L2 layer 222 in the element mounting area 320, and the like. The second metal layer 240 may also be removed from only the upper surface of the L2 layer 222 in the element mounting area 320.

Meanwhile in the above description, operations S350 and S360 are described by being distinguished, but operations S350 and S360 may also be performed simultaneously.

Thereafter, a protective layer 250 is formed on the remaining area except for the element mounting area 320 (S370). At this point, the protective layer 250 may be formed on the L1 layer 221, the interlayer insulating layer 230, and the like. The protective layer 250 may be formed on a portion of the upper surface of the interlayer insulating layer 230 exposed to the outside, but may also be formed on the entire upper surface of the interlayer insulating layer 230. FIG. 2 shows a state in which the protective layer 250 is formed on the remaining area except for the element mounting area 320.

Meanwhile, a plating layer may be formed on the L2 layer 222 in the element mounting area 320. The forming of the plating layer may be performed after performing operation S370 but may be performed before performing operation S370.

Meanwhile, in the present embodiment, the second metal layer 240 may formed on the interlayer insulating layer 230, and then the first via hole 231 may be formed in the via area 310, and thereafter, the L1 layer 221 and the third metal layer may be simultaneously formed.

Further, in the present embodiment, the fourth metal layer may be formed in the first via hole 231, and then the second metal layer 240 may be formed on the interlayer insulating layer 230 and the fourth metal layer.

Meanwhile, when, on one surface of the substrate layer 210, the first metal layer 220 is formed of three or more layers, and the interlayer insulating layer 230 is formed of two or more layers, operations S320 to S360 may be sequentially repeatedly performed after operation S360 is performed.

As an example, as shown in FIG. 3, when first metal layers 220 are formed of three layers, such as an L1 layer 221, an L2 layer 222, and an L3 layer 223, and interlayer insulating layers 230 are formed of two layers, such as a P1 layer 232 and a P2 layer 233, an operation of forming the L3 layer 223 on a substrate layer 210, and sequentially forming the P2 layer 233 and a second metal layer 240 on the L3 layer 223, and then forming a first via hole 231 in the P2 layer 233 and forming a third metal layer in the first via hole 231, an operation of forming the L2 layer 222 on the P2 layer 233, and an operation of sequentially stacking the P1 layer 232 and the second metal layer 240 on the L2 layer 222 may be sequentially performed.

Meanwhile, when first metal layers 220 are formed on both surfaces of the substrate layer 210, operations S310 to S370 may be performed for one surface of the substrate layer 210, and then may be performed for the other surface of the substrate layer 210. However, the present embodiment is not limited thereto. Operations S310 to S370 may be performed simultaneously for both surfaces of the substrate layer 210.

While the embodiments of the present invention have been described with reference to the accompanying drawings, it should be understood by those skilled in the art that various modifications may be made without departing from the technical spirit of the present invention and without changing essential features thereof. Therefore, it should be understood that the above-described embodiments are not restrictive but illustrative in all aspects.

INDUSTRIAL APPLICABILITY

The present invention may be applied to a circuit board.

The invention claimed is:

1. A multilayer board comprising:
a substrate layer;
a plurality of first metal layers sequentially stacked on the substrate layer;
an interlayer insulating layer formed between two different first metal layers, having a first via hole, and electrically connecting the two different first metal layers through a third metal layer formed in the first via hole;
a second metal layer formed between an upper layer of the two different first metal layers and the interlayer insulating layer; and
an element mounting area electrically connected to an external device,
wherein an L2 layer is formed below an L1 layer which is located on the uppermost side of the plurality of first metal layers, and
the L2 layer does not cover the L1 layer and is exposed to the outside in the element mounting area.

2. The multilayer board of claim 1, wherein the second metal layer and the first metal layer are different from each other in a metal composition or a crystal structure.

3. The multilayer board of claim 2, wherein when the second metal layer and the first metal layer are different from each other in the crystal structure,
the second metal layer is formed of any one of a metal layer including a metal having a face-centered cubic structure and a metal layer including a metal having a body-centered cubic structure, and
the first metal layer is formed of the other metal layer.

4. The multilayer board of claim 1, wherein the second metal layer is formed to have a thickness less than a thickness of each of the first metal layers.

5. The multilayer board of claim 1, wherein the second metal layer is formed to have a thickness of 1 nm to 50 nm.

6. The multilayer board of claim 1, wherein the third metal layer and the first metal layer have the same metal composition or crystal structure.

7. The multilayer board of claim 1, wherein the first metal layers, the interlayer insulating layer, and the second metal layer are formed only on one surface of the substrate layer or formed on both surfaces of the substrate layer.

8. The multilayer board of claim 1, further comprising a protective layer formed on an L1 layer located on the uppermost side of the plurality of first metal layers.

9. The multilayer board of claim 1, further comprising a fourth metal layer formed on the second metal layer and in the first via hole,
   wherein the fourth metal layer is formed to have the same metal composition or crystal structure as the first metal layer, and is formed to have a thickness of 0.01 μm to 5 μm.

* * * * *